United States Patent
Ogawa et al.

(10) Patent No.: US 11,342,156 B2
(45) Date of Patent: May 24, 2022

(54) CHARGED PARTICLE BEAM APPARATUS, SAMPLE ALIGNMENT METHOD OF CHARGED PARTICLE BEAM APPARATUS

(71) Applicant: Hitachi High-Tech Corporation, Tokyo (JP)

(72) Inventors: Hironori Ogawa, Tokyo (JP); Masaki Mizuochi, Tokyo (JP); Shuichi Nakagawa, Tokyo (JP); Motohiro Takahashi, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 17/152,287

(22) Filed: Jan. 19, 2021

(65) Prior Publication Data

US 2021/0265129 A1     Aug. 26, 2021

(30) Foreign Application Priority Data

Feb. 20, 2020    (JP) .............................. JP2020-026936

(51) Int. Cl.
    *H01J 37/20*      (2006.01)
    *G02B 21/26*      (2006.01)
           (Continued)

(52) U.S. Cl.
    CPC ................ *H01J 37/20* (2013.01); *G01C 3/08* (2013.01); *G02B 21/26* (2013.01); *G02B 21/36* (2013.01);
           (Continued)

(58) Field of Classification Search
    CPC .......... H01J 37/20; H01J 37/222; H01J 37/28; H01J 2237/24578; H01J 2237/2482;
           (Continued)

(56) References Cited

U.S. PATENT DOCUMENTS

2015/0248991 A1*   9/2015   Ogawa ............... G01B 9/02021
                                           250/491.1
2017/0062821 A1    3/2017   Long et al.

FOREIGN PATENT DOCUMENTS

CN        110070601 A      7/2019
JP        2000-114137 A    4/2000
                (Continued)

OTHER PUBLICATIONS

Taiwanese Office Action received in corresponding Taiwanese Application No. 110101562 dated Oct. 22, 2021.

*Primary Examiner* — Jason L McCormack
(74) *Attorney, Agent, or Firm* — Mattingly & Malur, PC

(57) ABSTRACT

A charged particle beam apparatus includes a sample stage on which a sample is mounted, a control device that controls to drive the sample stage, a linear scale that detects a position of the sample stage, laser position detection means for detecting the position of the sample stage, an optical microscope that observes the sample mounted on the sample stage, and a barrel that irradiates the sample mounted on the sample stage with an electron beam, and generates a secondary electron. Image data of a first correction sample mounted on the sample stage is acquired by the optical microscope, and position data of the sample stage is detected by the laser position detection means. The sample stage is positioned with respect to the barrel based on the image data acquired by the optical microscope and the position data of the sample stage detected by the laser position detection means.

10 Claims, 7 Drawing Sheets

(51) Int. Cl.
    *G02B 21/36*     (2006.01)
    *H01J 37/28*     (2006.01)
    *H01J 37/22*     (2006.01)
    *G01C 3/08*      (2006.01)

(52) U.S. Cl.
    CPC ............ *H01J 37/222* (2013.01); *H01J 37/28* (2013.01); *H01J 2237/24578* (2013.01); *H01J 2237/2817* (2013.01)

(58) Field of Classification Search
    CPC .... G01N 21/9501; G02B 21/26; G02B 21/36; G02B 21/9501; G06T 7/0004
    USPC .......................................... 250/306, 307, 311
    See application file for complete search history.

(56)             References Cited

FOREIGN PATENT DOCUMENTS

JP      2015-162396 A    9/2015
    TW       201129795 A     9/2011
    TW       201940323 A     10/2019

\* cited by examiner

CHARGED PARTICLE BEAM APPARATUS, SAMPLE ALIGNMENT METHOD OF CHARGED PARTICLE BEAM APPARATUS

CLAIM OF PRIORITY

The present application claims priority from Japanese Patent application serial no. 2020-026936, filed on Feb. 20, 2020, the content of which is hereby incorporated by reference into this application.

BACKGROUND OF THE INVENTION

1. Field of the Invention

The present invention relates to a configuration of a charged particle beam apparatus and a control method thereof, and particularly relates to an effective technology applied to a charged particle beam apparatus including an optical microscope that performs alignment of an observation sample.

2. Description of the Related Art

With the miniaturization of a semiconductor element, not only a manufacturing apparatus but also an inspection apparatus and an evaluation apparatus need to have high accuracy corresponding to each apparatus. In typical, a scanning electron microscope (hereinafter, referred to as an SEM) is used to evaluate a pattern formed on a semiconductor wafer and to inspect a defect of the pattern, and in particular, a length measurement SEM is used to evaluate a shape and a dimension of the pattern.

A defect review SEM is an apparatus that irradiates a wafer with an electron beam, performs image processing on an obtained secondary electron signal, discriminates an edge of a pattern from a change in brightness, and inspects a defect and the like on the wafer. The defect review SEM is provided with an XY stage capable of positioning a desired location on the wafer at an irradiation position of the beam in order to observe and inspect the entire wafer.

For example, there are a method of driving an XY stage by a rotary motor and a ball screw and a method of driving the XY stage by using a linear motor. A stage that performs rotational movement and the like along a Z-axis and around the Z-axis in addition to an XY plane may be used.

In order to accurately position the wafer, it is necessary to detect a stage position with high accuracy at the XY stage, and a method using a laser interferometer and a reflection mirror is known for this purpose.

The laser interferometer irradiates the reflection mirror with a laser beam and can detect the stage position with a resolution of several tens of picometers by interference with the reflected wave. Since measurement can be performed at the same height as the wafer, an Abbe error is minimized, and the laser interferometer is widely used to measure positions of many precision stages including the length measurement SEM.

In a semiconductor inspection apparatus including the defect review SEM, a stroke of the XY stage needs to be increased in response to an increase in a diameter of the wafer and diversification of wafer inspection means. When the wafer is observed by using wafer inspection means other than the SEM (for example, an optical microscope or the like), the stroke of the XY stage needs to be further increased.

When the stroke of the XY stage is increased, it is necessary to lengthen the reflection mirror together with the stroke in order to reflect the laser beam over the entire stroke range. In this case, it becomes difficult to secure flatness of a reflection mirror surface, and an increase in vibration due to the lengthening becomes a factor of deterioration of measurement accuracy. It is necessary to increase a size of a sample chamber itself in order to secure a movable region of the lengthened reflection mirror, and there is a problem that an increase in manufacturing and transportation costs and an increase in an installation area are caused.

In response to such problems, JP 2015-162396 A discloses a technology for switching to a stage positioning system using a length measurement method (for example, a linear scale) that does not use a mirror out of a positioning range using a laser by limiting a size of the mirror to a necessary minimum size.

Meanwhile, at the time of normal wafer inspection, after a wafer is mounted on a sample stage by a transfer robot or the like, processing called alignment for detecting wafer mounting position and angle on the stage is performed. In this alignment processing, a plurality of points on the wafer set in a measurement recipe in advance is imaged, and wafer position and angle are specified. Here, since it is necessary to perform position adjustment from the accuracy of the transfer robot or the like (substantially about several hundreds of μm) to positioning accuracy required in the SEM (for example, 100 nm or less), alignment processing having required position accuracy is performed by sequentially using a low-magnification optical microscope (hereinafter, referred to as an OM) and a high-magnification SEM image.

However, in recent years, there are some wafers on which the alignment processing using this SEM cannot be performed. In this case, it is necessary to perform the alignment processing of the wafer by using only the optical microscope. At this time, when the mirror length is designed to be limited to the necessary minimum size as described above, since the laser beam is out of an effective range during OM alignment, it is necessary to determine an SEM imaging position by using information of only the linear scale, and a decrease in position accuracy is unavoidable due to factors such as the Abbe error.

Thus, JP 2015-162396 A discloses a technology for correcting positional information of a laser value with high reproducibility by using a third absolute position sensor as means for correcting an offset amount between the linear scale and the laser.

JP 2000-114137 A discloses "an electron beam exposure apparatus that includes an electron beam source, convergence means for converging an electron beam output from the electron beam source, an electro-optical column which includes deflection means for deflecting the electron beam, a control device which controls the convergence means and the deflection means, a stage moving mechanism which moves a stage holding a sample irradiated with the electron beam, a mark detector which detects a reflected electron when a position detection mark on the sample or the stage is scanned by the electron beam and detects a position of the position detection mark from a signal of the detected reflected electron, and an optical mark detector which optically detects the position of the position detection mark, and the electron beam exposure apparatus includes at least two optical mark detectors".

SUMMARY OF THE INVENTION

However, according to the technology disclosed in JP 2015-162396 A, the offset amount of the laser value can be accurately corrected by using the third absolute position sensor, whereas when SEM observation is performed by using information of the OM alignment, it is necessary to correct a relationship between the OM position and the laser value through information of the scale value. Thus, the influence of the Abbe error present between the scale value and the OM position cannot be removed, and as a result, an error occurs in the SEM imaging position calculated by using the information of the OM alignment.

Similarly, in the technology disclosed in JP 2000-114137 A, there is the Abbe error between the position detection using the position detection mark and the detection of the position change using a displacement measurement mechanism, and the error occurs in the SEM imaging position.

Therefore, an object of the present invention is to provide a charged particle beam apparatus and a sample alignment method capable of performing highly accurate alignment even when only an optical microscope is used for alignment of a sample on a stage.

In order to solve the above problems, an aspect of the present invention provides a charged particle beam apparatus including a sample stage on which a sample is mounted, a control device that controls to drive the sample stage, a linear scale that detects a position of the sample stage, laser position detection means for detecting the position of the sample stage, an optical microscope that observes the sample mounted on the sample stage, and a barrel that irradiates the sample mounted on the sample stage with an electron beam, and generates a secondary electron. Image data of a first correction sample mounted on the sample stage is acquired by the optical microscope, and position data of the sample stage is detected by the laser position detection means. The sample stage is positioned with respect to the barrel based on the image data acquired by the optical microscope and the position data of the sample stage detected by the laser position detection means.

Another aspect of the present invention provides a sample alignment method of a charged particle beam apparatus. The method includes the following steps: (a) positioning a sample stage at a position capable of being imaged by an optical microscope for an alignment point registered in a recipe in advance, acquiring an optical microscope image of a sample mounted on the sample stage, and specifying a position of the alignment point viewed from the optical microscope based on the acquired optical microscope image, (b) acquiring an optical microscope image of a correction sample mounted on the sample stage and detecting position data of the sample stage by laser position detection means after the (a) step, and (c) positioning the sample stage based on the optical microscope image of the correction sample obtained in the (b) step and the position data of the sample stage detected by the laser position detection means.

According to the present invention, it is possible to realize a charged particle beam apparatus and a sample alignment method capable of performing highly accurate alignment even when only an optical microscope is used for alignment of a sample on a stage.

As a result, it is possible to improve accuracy of an observation position even for a wafer on which alignment using an SEM cannot be performed, and it is possible to perform more accurate wafer inspection.

Other objects, configurations, and effects will be made apparent in the following descriptions.

DESCRIPTION OF THE PREFERRED EMBODIMENTS

Figure 1:
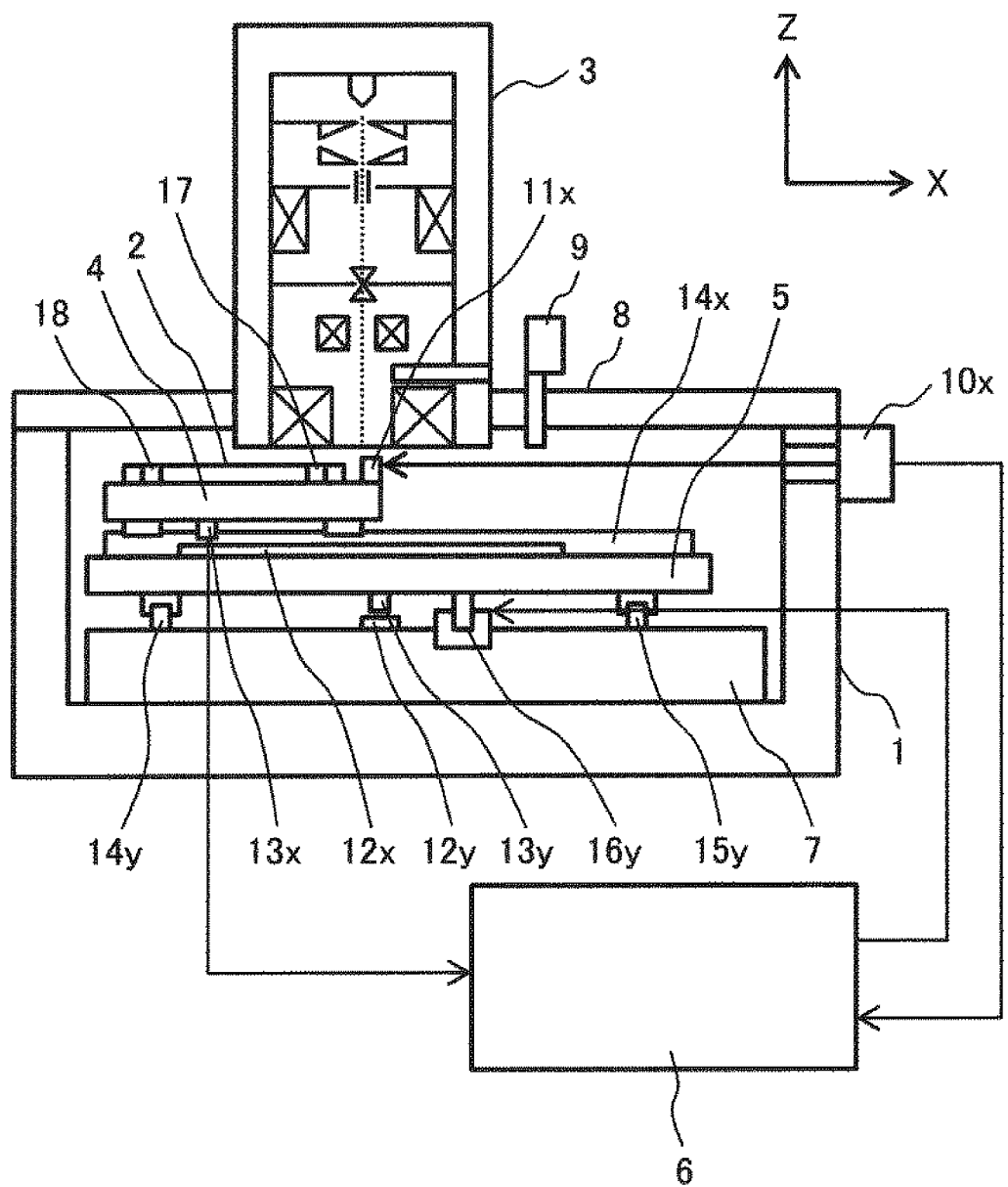
FIG. 1 is a cross-sectional view illustrating a schematic configuration of a charged particle beam apparatus according to an embodiment of the present invention.

Hereinafter, an embodiment of the present invention will be described with reference to the drawings. In the drawings, the same configurations are denoted by the same reference signs, and the detailed description of redundant portions will be omitted.

First Embodiment

A charged particle beam apparatus according to a first embodiment of the present invention and a sample alignment method using the same will be described with reference to FIGS. 1 to 7. FIG. 1 is a cross-sectional view illustrating a schematic configuration of the charged particle beam apparatus according to the present embodiment.

As illustrated in FIG. 1, in the charged particle beam apparatus according to the present embodiment, a Y table 5 freely movable in a Y direction (paper depth direction) is disposed via two Y linear guides 14$y$ and 15$y$ on a base 7 fixed in a sample chamber 1, and a Y linear motor 16$y$ is disposed so as to relatively generate a thrust in the Y direction between the base 7 and the Y table 5.

On the Y table 5, an X table 4 freely movable in an X direction via two X linear guides 14$x$ and 15$x$ (not illustrated) is arranged, and an X linear motor 16$x$ (not illustrated) is disposed so as to generate a thrust in the X direction between the Y table 5 and the X table 4.

Accordingly, the X table 4 is freely movable in the X and Y directions with respect to the base 7 and the sample chamber 1.

A wafer 2 is mounted on the X table 4. A wafer holding mechanism having a holding force such as a mechanical restraining force or an electrostatic force is used for mounting the wafer 2.

A top plate 8 and a column (barrel) 3 are arranged on the sample chamber 1. An electron optics system for generating a secondary electron image by irradiation with an electron beam is provided at the column (barrel) 3. An optical microscope 9 for observing the wafer 2 at a low magnification is disposed on the top plate 8.

A Y linear scale 12$y$ is disposed on the base 7 in the Y direction, and a Y linear scale detector 13$y$ is disposed on the Y table 5 so as to face the Y linear scale. The Y linear scale 12$y$ and the Y linear scale detector 13$y$ measure a relative displacement amount of the Y table 5 and the base 7 in the Y direction (hereinafter, referred to as a Y scale value).

Similarly, an X linear scale 12$x$ is disposed in the Y table 5, and an X linear scale detector 13$x$ is disposed on the X table 4 so as to face the X linear scale. The X linear scale 12$x$ and the X linear scale detector 13$x$ measure a relative displacement amount of the X table 4 and the Y table 5 in the X direction (hereinafter, referred to as an X scale value). With the above configuration, it is possible to measure the relative displacement amounts of the X table 4 and the base 7 in the X and Y directions.

An X mirror 11x is disposed on the X table 4, and an X laser interferometer 10x is disposed on a side surface of the sample chamber 1. The X laser interferometer 10x measures a relative displacement amount of the sample chamber 1 and the X table 4 in the X direction (hereinafter, referred to as an X laser value) by irradiating the X mirror 11x with a laser beam and using reflected light thereof.

The X mirror 11x has a mirror surface on a YZ plane, has a long rod-like shape in the Y direction, and can reflect the laser beam even when the Y table 5 moves in the Y direction. The X mirror is arranged such that a height of the laser beam substantially coincides with an upper surface (measurement surface) of the wafer 2 in a Z direction. Similarly, in the Y direction, a relative displacement amount of the sample chamber 1 and the X table 4 in the Y direction (hereinafter, referred to as a Y laser value) can also be measured by a Y laser interferometer 10y (not illustrated) and a Y mirror 11y (not illustrated).

Here, the laser interferometers 10x and 10y in the X and Y directions can measure effective values only in a region in which the corresponding mirrors 11x and 11y in the X and Y directions are irradiated with the laser beam in a movable range of the X table 4. When the X table moves to a position at which the laser beam is not reflected even once, offset amounts of the laser values become unsettled after that, and thus, the laser interferometers 10x and 10y cannot measure an absolute position.

Both the X laser value and the X scale value indicate the relative displacement amount of the X table 4 in the X direction with respect to the sample chamber 1, but these values do not accurately coincide with each other due to an Abbe error. That is, since measurement positions of the X laser value and the X scale value have an offset in the Z direction, the Abbe error occurs when an attitude angle of the X table 4 changes due to the movement or vibration of the table. Similarly, the Abbe error occurs for the Y laser value and the Y scale value.

A control device 6 includes an arithmetic processing unit, a motor drive amplifier, and the like. The control device 6 drives a stage in the X and Y directions by controlling drive currents of the linear motors with the laser values and the scale values in the X and Y directions as inputs, and positions the stage at a desired position. Here, PID control or the like can be used as a method of controlling the linear motors.

With the above configuration, the wafer 2 moves with respect to the sample chamber 1 in an XY plane, and a secondary electron image (SEM image) using the column (barrel) 3 and an optical microscope image (OM image) using the optical microscope 9 can be acquired at any coordinates on the wafer 2.

Correction samples 17 and 18 are arranged on the X table 4. Here, the correction samples 17 and 18 are installed such that upper surfaces thereof substantially coincide with a front surface (upper surface) of the wafer 2. The detailed arrangement and usage method of the correction samples 17 and 18 will be described later.

Although it has been described in the present embodiment that the linear guides are used as guide mechanisms, other guide mechanisms (for example, fluid bearings, magnetic bearings, and the like) can also be used. Although it has been described that the linear motors are used as drive mechanisms, actuators available in vacuum such as a ball screw and a piezoelectric actuator may also be used.

Figure 2:
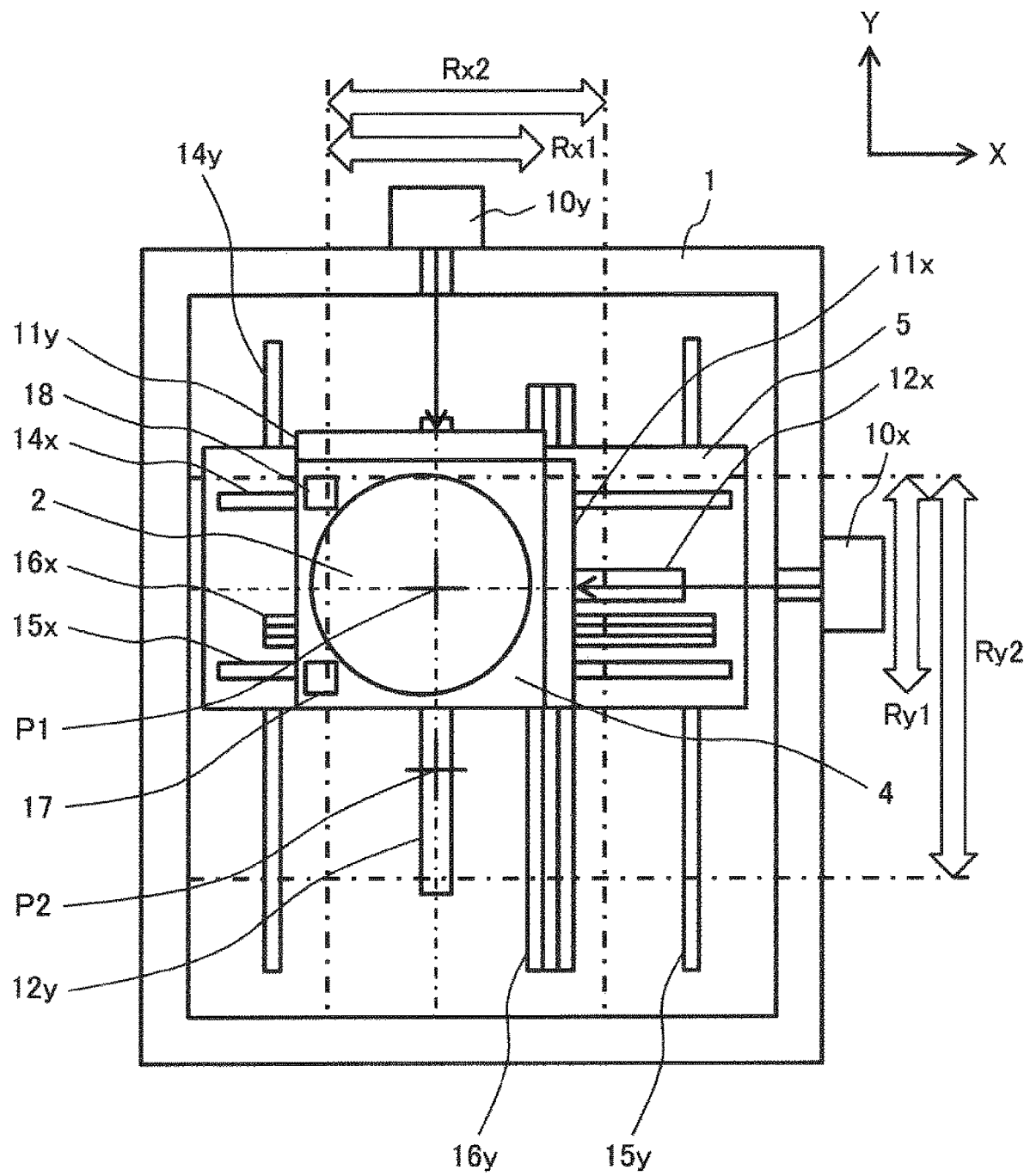
FIG. 2 is a top view of the charged particle beam apparatus of FIG. 1 (laser visible state)

FIG. 2 is a top view illustrating a configuration of the charged particle beam apparatus according to the present embodiment, and illustrates a table position arrangement in a laser visible state.

The laser interferometers 10x and 10y irradiate the mirrors 11x and 11y with the laser beams, and XY coordinates of the wafer 2 can be measured by both the scale value and the laser value.

A position P1 in this figure is an intersection of the laser beams emitted from the laser interferometers 10x and 10y, and the column (barrel) 3 is disposed such that a center of the column (barrel) 3 (a position irradiated with the electron beam for acquiring the secondary electron image) coincides with P1.

Accordingly, positional information of a measurement point (electron beam irradiation position) can be measured by the laser values without the Abbe error with respect to an attitude change (yawing) of the wafer 2 around a Z-axis. Strokes of the tables in the X and Y directions required for observing the entire surface of the wafer 2 by the column (barrel) 3 are in ranges of Rx1 and Ry1 in this figure.

A position P2 is a position at which the optical microscope 9 is installed at the top plate 8 (not illustrated), and is a position observable by the optical microscope 9. Normally, P2 is difficult to be disposed at the same position as P1 due to limitations on a size of the electron optics system in the column (barrel) 3, and becomes a position having an offset. The strokes of the tables in the X and Y directions required for observing the entire surface of the wafer 2 by the optical microscope 9 are in ranges of Rx2 and Ry2 in this figure.

Although it has been described in the present embodiment that the optical microscope is used as detection means other than the SEM, this configuration is also effective when other detection means or sensors are used for observing or sensing the wafer. Although it has been described in the present embodiment that the position P2 is a position offset only in the Y direction with respect to the position P1 which is the center of the column (barrel) 3 (a position at which the offset amount in the X direction is 0), a configuration in which there are offset in the X and Y directions can be of course used.

Here, since it is necessary to accurately detect positional information of the wafer 2 (without the Abbe error) during SEM observation, it is effective to position the stage by using the laser values. Meanwhile, since the optical microscope 9 has a lower magnification than the SEM, sufficient image accuracy can be guaranteed even though the stage is positioned by using the scale values without using high-accuracy laser values. That is, for example, in the X direction, the X laser value may be used for the range of Rx1, and the X scale value may be used for a range other than Rx1 in Rx2.

From the above, in the present embodiment, a mirror length is set to a necessary minimum length by determining a length of the Y mirror 11y so as to cover the range of Rx1 and determining a length of the X mirror 11x so as to cover the range of Ry1.

In FIG. 2, since both the laser value and the scale value can be obtained, it is desirable that the control device 6 determines the drive currents of the linear motors 16x and 16y by using both the values.

Figure 3:
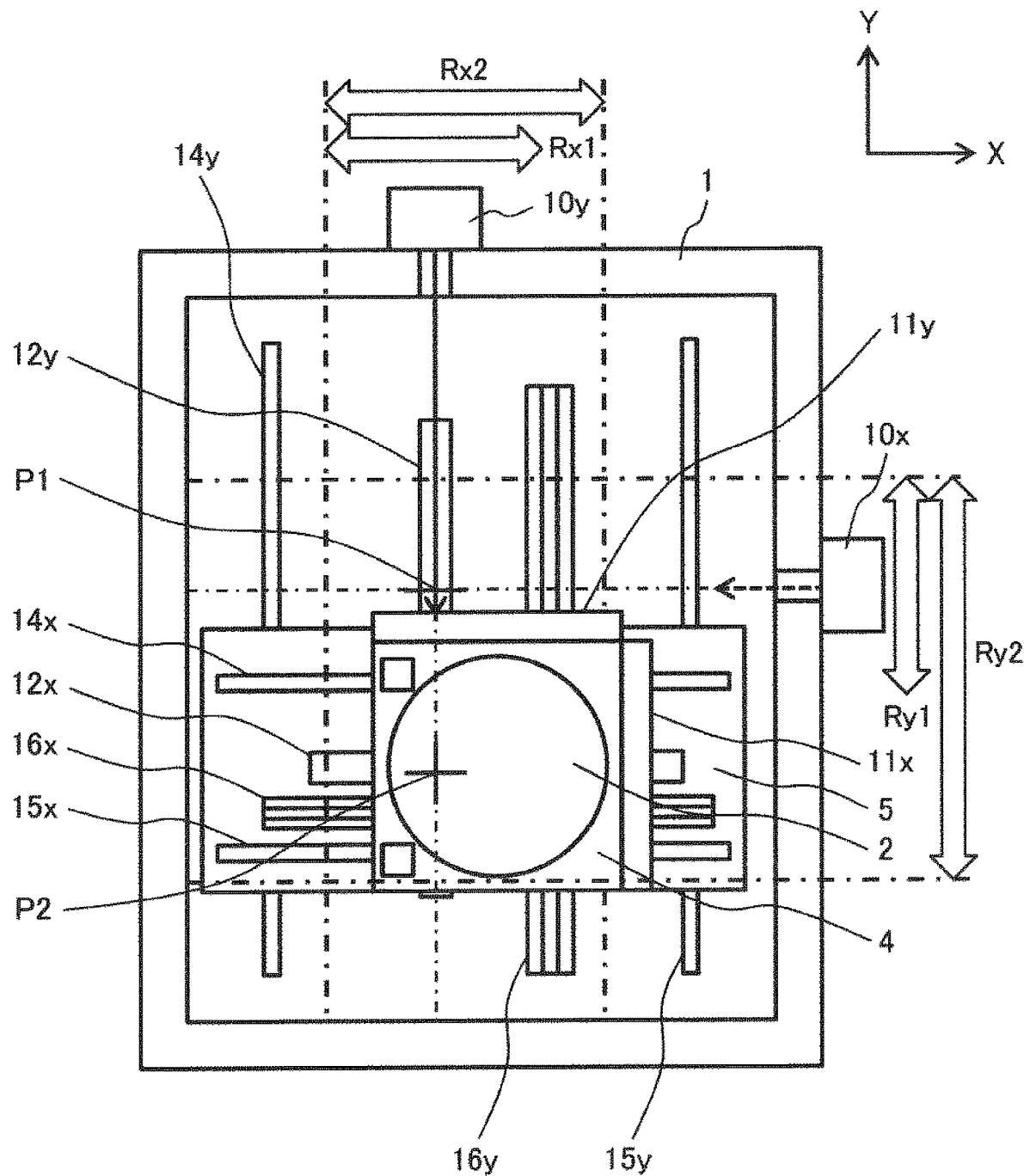
FIG. 3 is a top view of the charged particle beam apparatus of FIG. 1 (laser invisible state)

FIG. 3 is a top view illustrating the configuration of the charged particle beam apparatus according to the present embodiment, and illustrates a table position arrangement in a laser invisible state.

Since the laser interferometer 10x does not irradiate the mirror 11x with the laser beam, the X coordinate of the wafer 2 can be measured only by the scale value. Thus, the control device 6 controls the drive current of the linear motor 16x by using only the scale value. Here, since the measurement position P2 of the optical microscope 9 has an offset with respect to the column center position P1 as described above, when the entire surface of the wafer 2 is imaged by the optical microscope 9, there is a region in which the laser interferometer becomes invalid as illustrated in FIG. 3. When alignment (OM alignment) processing using the optical microscope image is performed, the laser interferometer becomes invalid due to setting of an alignment point on the wafer, and the laser value may not be frequently measured. As a result, it is difficult to accurately perform SEM imaging using the laser value only by the OM alignment processing at any point.

Figure 4:
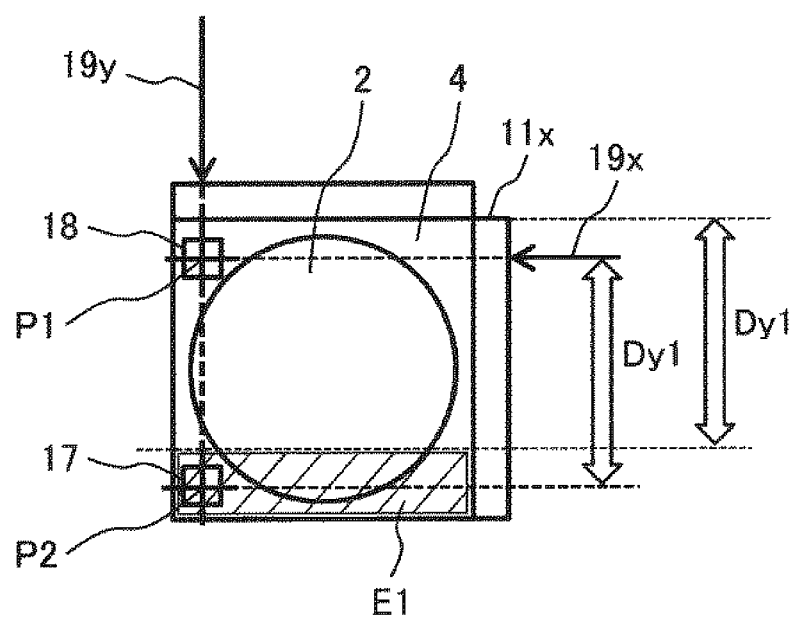
FIG. 4 is a diagram illustrating an arrangement example of a correction sample on an X table.

FIG. 4 is an arrangement configuration diagram of the correction samples 17 and 18 on the X table 4 in the present embodiment. Here, FIG. 4 illustrates a state in which the X table 4 is positioned such that the correction sample 17 coincides with the optical microscope observation position P2 on the X table 4. Hereinafter, the arrangement of the correction samples 17 and 18 will be described with reference to FIG. 4.

In FIG. 4, an offset amount between the column center position P1 and the optical microscope observation position P2 is defined as Dy1. Here, Dy1 is determined from the installation positions of both the correction samples on the top plate. Subsequently, in a laser irradiation range of the X mirror 11x, a region of the X table 4 which is lower than a straight line moved from an end close to the position P1 by the offset amount Dy1 (farther from P1) is defined as E1. This region E1 is a range in which the X mirror 11x is irradiated with a laser beam 19x during imaging with the optical microscope 9 and the laser value becomes effective.

This region E1 is defined as a range in which the correction sample 17 is installable in the present embodiment, and in the present embodiment, the correction sample 17 is disposed at a position avoiding the wafer 2 in the region E1. The correction sample 18 is disposed at a position offset from the correction sample 17 by the distance Dy1.

According to the correction samples 17 and 18 arranged in this manner, the optical microscope image of the correction sample 17, the laser values in the X and Y directions, and the SEM image of the correction sample 18 can be simultaneously acquired.

Figure 5:
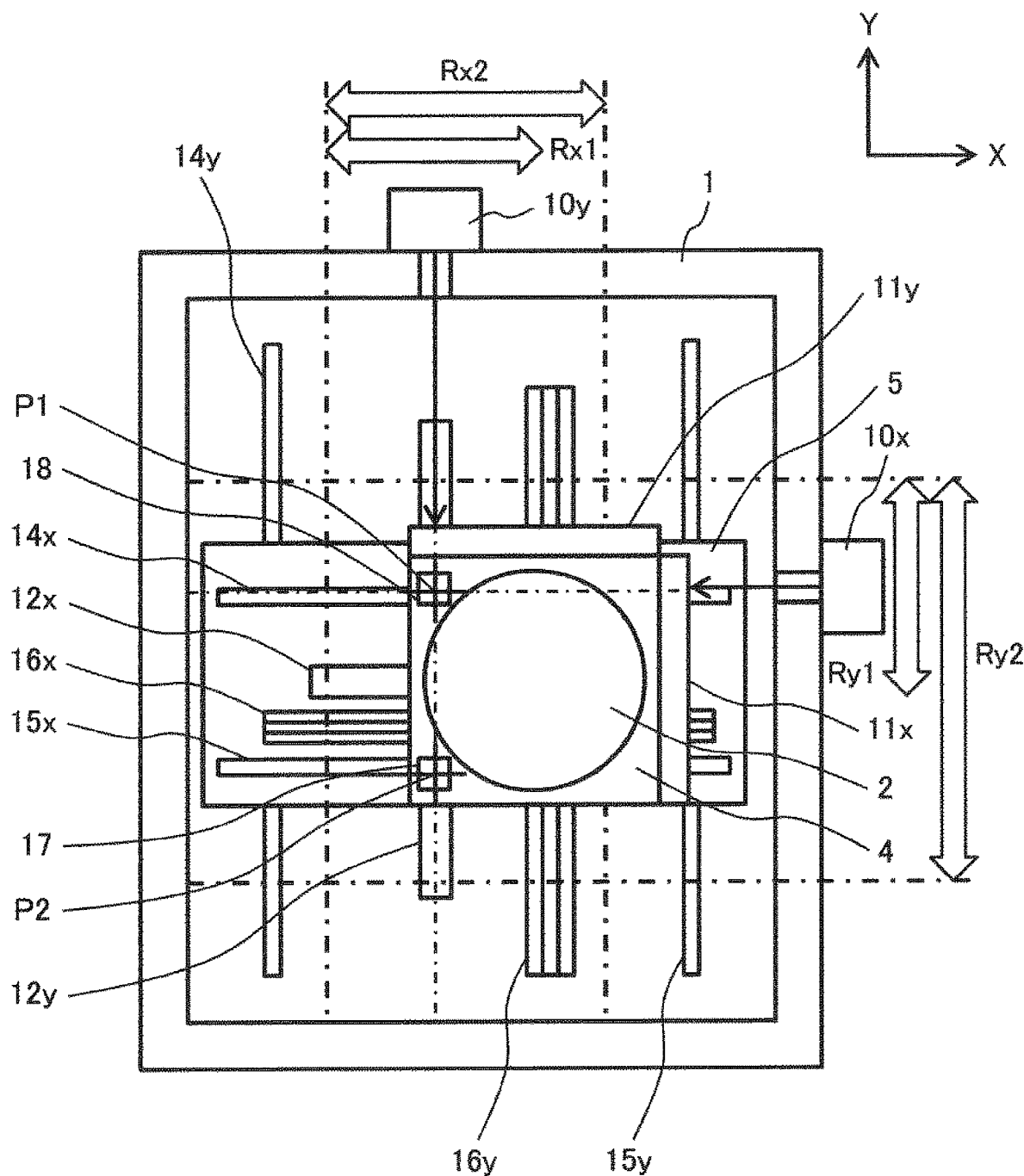
FIG. 5 is a top view of the charged particle beam apparatus of FIG. 1 (correction sample imaging state)

FIG. 5 is a top view illustrating the configuration of the charged particle beam apparatus according to the present embodiment, and illustrates a table position arrangement in a state in which the correction samples are imaged.

Similar to the state of FIG. 4, in FIG. 5, the position P2 is on the correction sample 17, the position P1 is on the correction sample 18, and the X and Y laser interferometers 10x and 10y are in the effective state. In the state illustrated in FIG. 5, more accurate alignment processing can be performed by performing correction to be described later by using the SEM image and the OM image obtained by the optical microscope 9.

Figure 6:
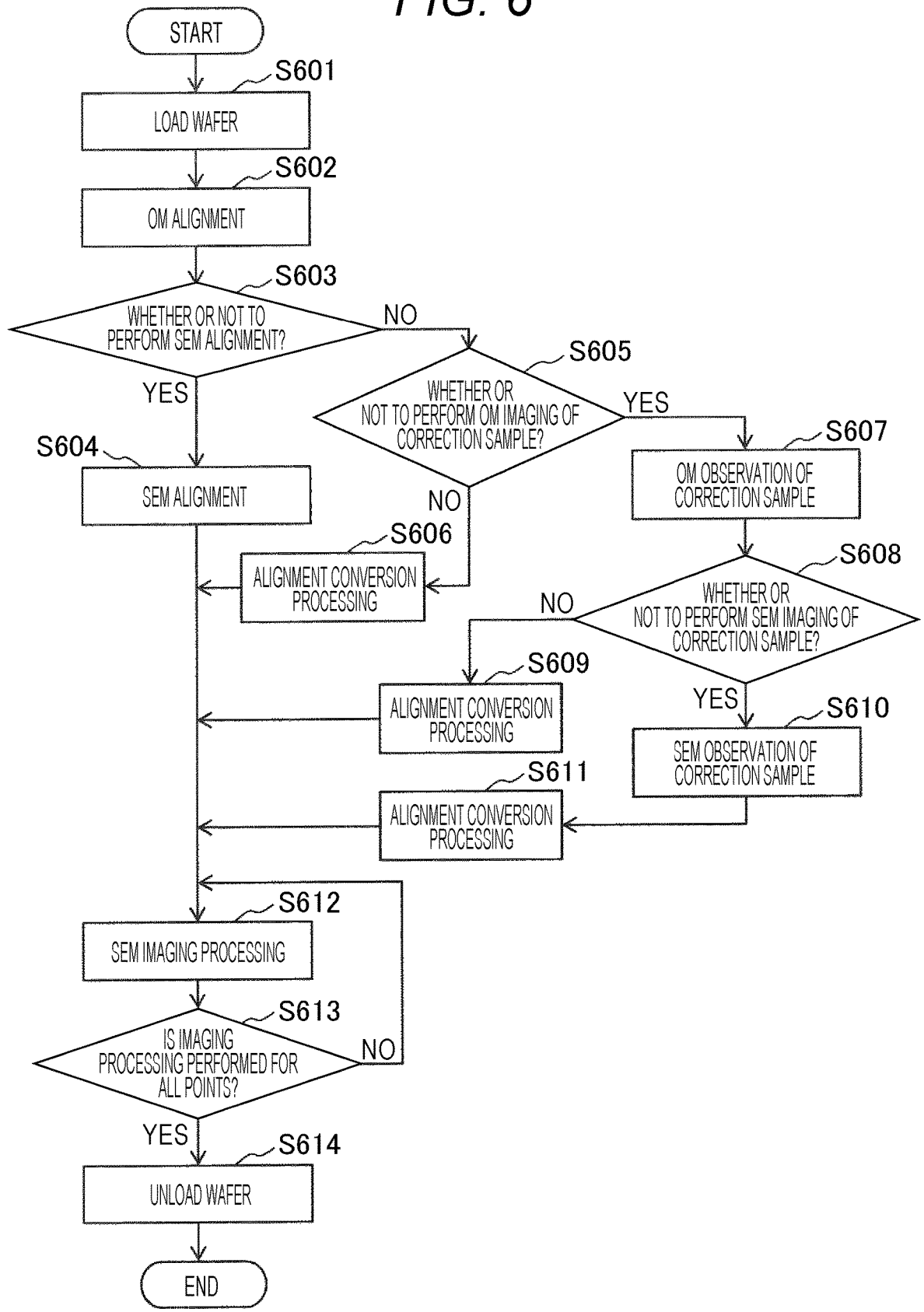
FIG. 6 is a flowchart illustrating a sample alignment method of the charged particle beam apparatus according to the embodiment of the present invention.

FIG. 6 is a flowchart illustrating a sample alignment method (wafer processing flow) in the present embodiment.

First, in processing S601, the wafer is loaded into the sample chamber, and is mounted on the X table. The wafer is loaded by using a wafer transfer robot or the like. In order to load the wafer present in atmosphere into the sample chamber exhausted into a vacuum, a method using a preliminary exhaust chamber, a gate valve, and the like is common.

Subsequently, in processing S602, the OM alignment processing using the optical microscope is performed. Specifically, the X table is sequentially positioned at a position capable of being imaged by the optical microscope for one or a plurality of OM alignment points registered in an inspection recipe in advance, and the OM image is acquired. A position deviation amount on the image is calculated by comparing the obtained OM image with a reference pattern registered in the inspection recipe, and the position (XY coordinates) of the alignment point viewed from the OM is specified.

A relative positional relationship of the transferred wafer with respect to the X table is obtained by averaging the position of one or the plurality of OM alignment points. The obtained wafer transfer position is defined by an offset amount (Xom, Yom) in the X and Y directions and a rotation angle (θom) viewed from the OM.

Subsequently, in processing S603, it is determined whether or not to perform SEM alignment in the inspection recipe. Here, it is common to operate the SEM alignment in a normal inspection recipe (YES), but in the case of an inspection recipe with no any problem even though the accuracy is low or a wafer on which the SEM alignment cannot be performed, it is determined not to perform the SEM alignment (NO).

When it is determined to perform the SEM alignment (YES in this figure), the processing proceeds to processing S604, and SEM alignment processing S604 is executed. Similar to OM alignment processing S602, in SEM alignment processing S604, the X table is positioned for one or the plurality of SEM alignment points registered in the inspection recipe in advance, the SEM image is acquired, and the position of the wafer is specified by comparing the acquired SEM image with the reference pattern registered in the inspection recipe.

Meanwhile, when it is determined not to perform the SEM alignment in processing S603 (NO in this figure), the processing proceeds to processing S605, and it is determined whether or not to perform the OM imaging of the correction sample. Here, in the case of the inspection recipe with no any problem even though the accuracy is low as described above, it is determined not to perform the OM imaging of the correction sample (NO in this figure), and in an inspection recipe that requires high accuracy but cannot perform the SEM alignment, it is determined to perform the OM imaging of the correction sample (YES in this figure).

When it is determined not to perform the OM imaging of the correction sample (NO in this figure) in processing S605, alignment conversion processing S606 is performed. Here, in alignment conversion processing S606, it is necessary to convert into an offset amount (Xsem, Ysem) in the X and Y directions and a rotation angle (θsem) viewed from the SEM column which are information necessary for an SEM inspection.

Since relative positions of the SEM column center position P1 and the OM position P2 are determined by an attachment position of the optical microscope 9, Xsem=Xom+Xofs, Ysem=Yom+Yofs, and θom=θom+θofs can be satisfied by using an offset amount (Xofs, Yofs, θofs) in the X, Y, and rotation directions. Accordingly, the SEM imaging can be performed without the SEM alignment while reflecting the result of the OM alignment.

Here, the offset amount (Xofs, Yofs, θofs) for converting OM alignment information is the offset amount on the wafer, that is, it is necessary to manage the offset amount by the laser value. Meanwhile, it is considered that the stage moves out of a laser effective range as described above during the OM alignment. Thus, it is necessary to control the stage by using the scale value during the OM alignment.

When the SEM imaging is performed after the OM alignment having only information of the scale value is performed, since it is necessary to move the stage by using the scale value in order to correct the offset amount (Xofs and the like), there is a possibility that a large error (deviation in the SEM observation position) occurs due to the influence of the Abbe error occurring in the laser value and the scale value. It is considered that the relative positions of the SEM column center position P1 and the OM position P2 fluctuate due to environmental changes such as a temperature and an atmospheric pressure. In order to reduce the above-described error factors, the correction samples are used in the present invention.

When it is determined to perform the OM imaging of the correction sample in processing S605 (YES in this figure), the processing proceeds to processing S607, and the OM imaging of the correction sample is performed. In processing S607, first, the X table is positioned at the position at which the correction sample 17 is observable by the OM, and the imaging is performed by the OM as illustrated in FIG. 5. Similar to OM alignment processing S602, the position deviation amount on the image is calculated by comparing the imaged OM image with the reference pattern registered in the apparatus (inspection recipe), and the position (XY coordinates) of the correction sample 17 viewed from the OM is specified.

At this time, since the laser values are effective for both the laser interferometers 10x and 10y, the laser values at the correction sample positions are also acquired. As illustrated in FIG. 5, when the correction sample 18 is mounted so as to be below the column center position P1 on the X table 4, the correction sample 18 is simultaneously imaged by the SEM. Similarly, the position deviation amount on the image is calculated by comparing the imaged SEM image with the reference pattern registered in the apparatus (inspection recipe), and the position (XY coordinates) of the correction sample 18 viewed from the SEM is specified.

Subsequently, in processing S608, it is determined whether or not to perform the SEM imaging of the correction sample 17. When it is determined not to perform the SEM imaging of the correction sample 17 in processing S608 (NO in this figure), the alignment conversion processing is performed in processing S609. Similar to processing S606, the alignment conversion processing is performed by using Xsem=Xom+Xofs, Ysem=Yom+Yofs, and θom=θom+θofs.

Here, the laser value at an SEM imaging point to be moved can be specified by using the laser value when the OM imaging is performed on the correction sample. The stage is moved such that the obtained laser value as a target position and a current laser value coincide with each other, and thus, accurate movement to the SEM measurement point, that is, highly accurate SEM imaging without the SEM alignment can be performed.

When the correction sample 18 is mounted, the relative positions of the SEM column center position P1 and the OM position P2 can be calculated from pattern positions in the OM image and the SEM image simultaneously imaged. The offset amount (Xofs, Yofs) used for converting the OM alignment information is adjusted by using the relative positions, and thus, it is possible to perform better offset conversion without being influenced by the fluctuations due to the environmental changes such as the temperature and the atmospheric pressure.

Meanwhile, when it is determined to perform the SEM imaging of the correction sample 17 in processing S608 (YES in this figure), the SEM imaging of the correction sample 17 is performed in processing S610. When the SEM imaging of the correction sample 17 is performed, the OM imaging and the SEM imaging are performed on the same point in processing S607 and processing S610. At this time, since the stage is controlled in a state in which the laser value is effective in both cases, the relative positions of the SEM column center position P1 and the OM position P2 with the laser values can be calculated.

Accordingly, detection accuracy at the SEM position can be ensured with high accuracy not only even when a distance between the SEM column center position and the OM position changes due to environmental factors such as the temperature, but also even when an internal structure of the sample chamber such as the X table changes due to the temperature changes.

In processing S605 and processing S608, the imaging may be set to be performed when there is an attempt to perform the SEM imaging with high accuracy, but there are a throughput decrease and a trade-off due to an imaging time, an arithmetic processing time, and a stage movement time. It is effective to allow a user to explicitly set processing accuracy by designating or selecting necessary accuracy as a setting on the inspection (measurement) recipe. It is also possible to automatically select the processing accuracy for each inspection recipe according to the SEM imaging magnification and the like.

In processing S612, due to the use of the positional information (Xsem, Ysem, θsem) of the wafer viewed from the SEM column which is measured by the SEM alignment set as described above or estimated by using the OM alignment information, the stage is positioned for the measurement points set in the recipe in advance by using the laser value, and the inspection of the pattern (detection of a defect, measurement of a pattern shape, or the like) is performed from the secondary electron image obtained by performing the imaging using the SEM. In processing S613, it is determined whether or not the positioning is completed for all the measurement points, and when the measurement is completed, the wafer is loaded out in processing S614, and a series of processing is ended.

Figure 7:
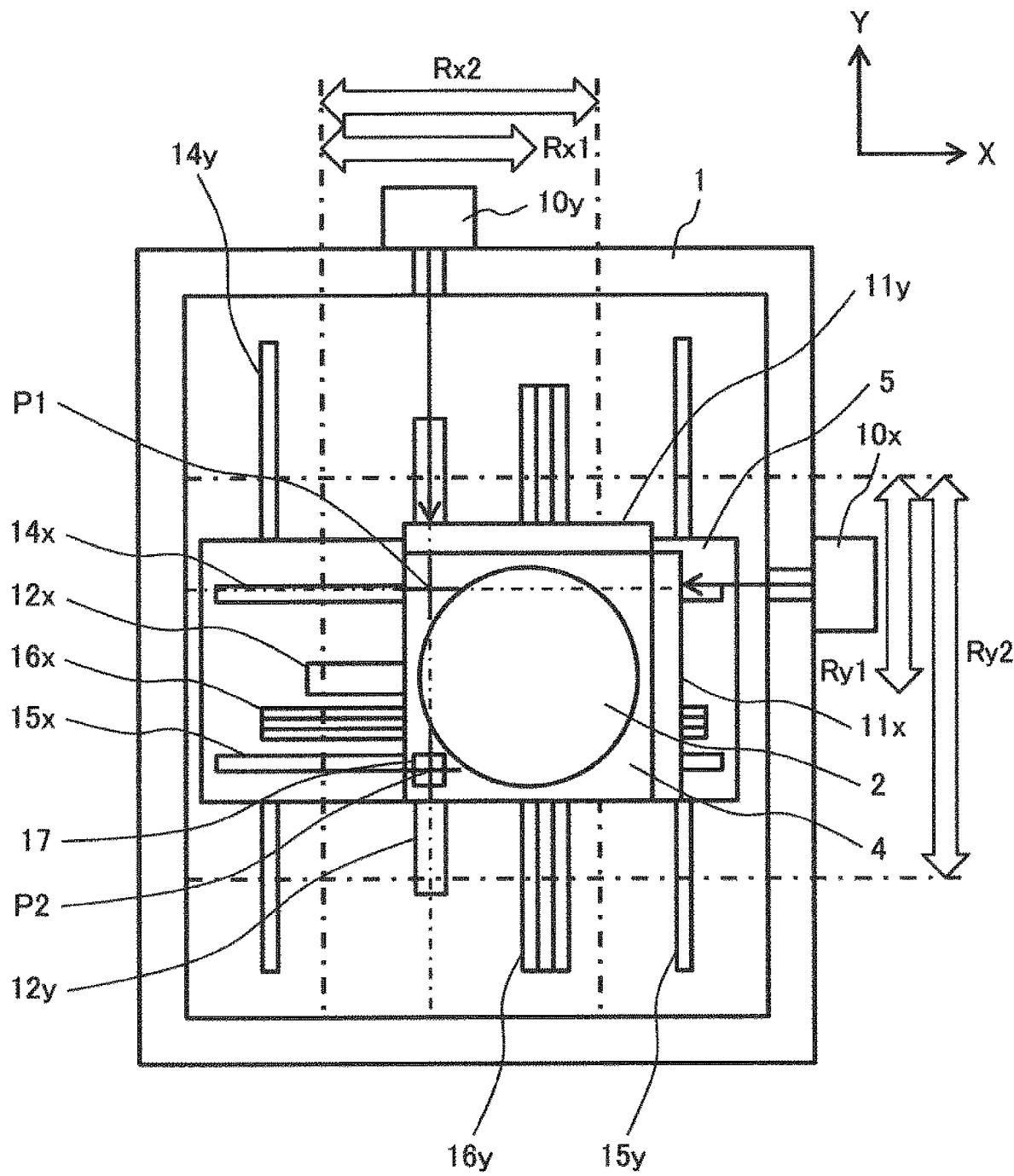
FIG. 7 is a top view of the charged particle beam apparatus of FIG. 1 (one correction sample imaging state).

Although it has been mainly described in the present embodiment that the correction sample 17 to be observed first by the OM and the correction sample 18 capable of being simultaneously imaged by the SEM are mounted as the correction samples to be disposed on the X table as illustrated in FIG. 5, only the correction sample 17 may be mounted as illustrated in FIG. 7.

In this case, in processing S607 of FIG. 6, only the OM imaging is performed, and the relative positions of the SEM column center position P1 and the OM position P2 cannot be corrected. However, since the movement to the SEM imaging position using the laser value can still be performed, a sufficiently high effect can be expected. In this case, it is effective because the relative positions of P1 and P2 can be corrected by the laser value by determining to perform the SEM imaging of the correction sample in processing S608 of FIG. 6.

As described above, there is provided the charged particle beam apparatus of the present embodiment including a sample stage (the X table 4 and the Y table 5) on which a sample (the wafer 2) is mounted, a control device 6 that controls to drive the sample stage (the X table 4 and the Y table 5), laser position detection means (the laser interferometer 10 and the mirror 11) for detecting the position of the sample stage (the X table 4 and the Y table 5), an optical microscope 9 that observes the sample mounted on the sample stage (the X table 4 and the Y table 5), and a barrel 3 that irradiates the sample mounted on the sample stage (the X table 4 and the Y table 5) with an electron beam, and generates a secondary electron. Image data of a first correction sample 17 mounted on the sample stage (the X table 4 and the Y table 5) is acquired by the optical microscope 9, and position data of the sample stage (the X table 4 and the Y table 5) is detected by the laser position detection means (the laser interferometer 10 and the mirror 11). The sample stage (the X table 4 and the Y table 5) is positioned with respect to the barrel 3 based on the image data acquired by the optical microscope 9 and the position data of the sample stage (the X table 4 and the Y table 5) detected by the laser position detection means (the laser interferometer 10 and the mirror 11).

There is provided a sample alignment method of a charged particle beam apparatus of the present embodiment. The method includes the following steps: (a) positioning a sample stage at a position capable of being imaged by an optical microscope for an alignment point registered in a recipe in advance, acquiring an optical microscope image of a sample mounted on the sample stage, and specifying a position of the alignment point viewed from the optical microscope based on the acquired optical microscope image, (b) acquiring an optical microscope image of a correction sample mounted on the sample stage and detecting position data of the sample stage by laser position detection means after the (a) step, and (c) positioning the sample stage based on the optical microscope image of the correction sample obtained in the (b) step and the position data of the sample stage detected by the laser position detection means.

The charged particle beam apparatus according to the present embodiment and the sample alignment method thereof can be applied to, for example, a defect review SEM and the like for detecting a defect of a pattern formed on a wafer or measuring a pattern shape. Accordingly, even for wafers on which the SEM alignment cannot be performed, after the OM alignment is performed, the OM imaging and the SEM imaging using the correction samples are performed, and the obtained image information and the laser values are used. Accordingly, the accuracy of the observation position using the SEM is improved, and more accurate wafer inspection can be performed.

The present invention is not limited to the aforementioned embodiments, and includes various modification examples. For example, the aforementioned embodiments are described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. In addition, the components of another embodiment can be added, removed, and substituted to, from, and into some of the components of the aforementioned embodiments.

What is claimed is:

1. A charged particle beam apparatus comprising:
    a sample stage on which a sample is mounted;
    a control device that controls to drive the sample stage;
    a linear scale that detects a position of the sample stage;
    laser position detection means for detecting the position of the sample stage;
    an optical microscope that observes the sample mounted on the sample stage;
    a scanning electron microscope (SEM); and
    a barrel that irradiates the sample mounted on the sample stage with an electron beam, and generates a secondary electron,
        wherein image data of a first correction sample mounted on the sample stage is acquired by the optical microscope and position data of the sample stage during acquisition of the image data by the optical microscope is detected by the laser position detection means,
    wherein the sample stage is positioned with respect to the barrel based on the image data acquired by the optical microscope and the position data of the sample stage detected by the laser position detection means by specifying position data of an SEM imagining point using the detected position data of the sample stage detected by the laser position detection means during acquisition of the image data by the optical microscope, and
        wherein image data of the first correction sample mounted on the sample stage is acquired by the SEM.

2. The charged particle beam apparatus according to claim 1, wherein a position deviation amount on an image is calculated by comparing the image data acquired by the optical microscope with a reference pattern registered in advance, and a position of the first correction sample viewed from the optical microscope is specified.

3. The charged particle beam apparatus according to claim 1, wherein
    an SEM image of a second correction sample mounted on the sample stage is acquired, and
    the sample stage is positioned with respect to the barrel based on the image data acquired by the optical microscope, the position data of the sample stage detected by the laser position detection means, and the SEM image.

4. The charged particle beam apparatus according to claim 3, wherein a position deviation amount on an image is calculated by comparing the acquired SEM image with a reference pattern registered in advance, and a position of the second correction sample viewed from the barrel is specified.

5. The charged particle beam apparatus according to claim 1, wherein the charged particle beam apparatus is a defect review SEM that detects a defect of a pattern formed on a wafer or measures a pattern shape.

6. A sample alignment method of a charged particle beam apparatus, the method comprising the following steps:
    (a) positioning a sample stage at a position capable of being imaged by an optical microscope for an alignment point registered in a recipe in advance, acquiring an optical microscope image of a sample mounted on the sample stage, and specifying a position of the alignment point viewed from the optical microscope based on the acquired optical microscope image;
    (b) acquiring an optical microscope image of a correction sample mounted on the sample stage and detecting position data of the sample stage during acquisition of the image data by the optical microscope by laser position detection means after the (a) step;
    (c) positioning the sample stage based on the optical microscope image of the correction sample obtained in the (b) step and the position data of the sample stage detected by the laser position detection means by specifying position data of an SEM imagining point using the detected position data of the sample stage during acquisition of the image data by the optical microscope; and acquiring image data of the first correction sample mounted on the sample stage is by an SEM.

7. The sample alignment method of a charged particle beam apparatus according to claim 6, wherein, in the (b) step, a position deviation amount on an image is calculated by comparing the optical microscope image of the correction sample acquired by the optical microscope with a reference pattern registered in advance, and a position of the correction sample viewed from the optical microscope is specified.

8. The sample alignment method of a charged particle beam apparatus according to claim 6, further comprising:

(d) disposing another correction sample different from the correction sample on the sample stage, acquiring an SEM image of the other correction sample, and positioning the sample stage based on the acquired optical microscope image, the position data of the sample stage detected by the laser position detection means, and the SEM image, between the (b) step and the (c) step.

9. The sample alignment method of a charged particle beam apparatus according to claim 8, wherein, in the (d) step, a position deviation amount on an image is calculated by comparing the acquired SEM image with a reference pattern registered in advance, and a position of the other correction sample is specified.

10. The sample alignment method of a charged particle beam apparatus according to claim 6, wherein a defect on a pattern formed on a wafer is detected or a pattern shape is measured.

* * * * *